United States Patent
Kim et al.

(10) Patent No.: US 6,463,002 B2
(45) Date of Patent: Oct. 8, 2002

(54) REFRESH-TYPE MEMORY WITH ZERO WRITE RECOVERY TIME AND NO MAXIMUM CYCLE TIME

(75) Inventors: Chang-Rae Kim, Sungnam; Jong-Yul Park, Yongin; Min-Chul Chung, Seoul; Sang-Jib Han, Suwon, all of (KR)

(73) Assignee: Samsung Electronics Co., Ltd., Hwasung (KR)

( * ) Notice: Subject to any disclaimer, the term of this patent is extended or adjusted under 35 U.S.C. 154(b) by 0 days.

(21) Appl. No.: 09/803,064

(22) Filed: Mar. 8, 2001

(65) Prior Publication Data

US 2002/0001247 A1 Jan. 3, 2002

Related U.S. Application Data

(62) Division of application No. 09/609,200, filed on Jun. 30, 2000.

(51) Int. Cl.[7] .................................................. G11C 7/00
(52) U.S. Cl. ................... 365/222; 365/149; 365/189.01
(58) Field of Search ................................. 365/222, 149, 365/189.01

(56) References Cited

U.S. PATENT DOCUMENTS

| | | | | |
|---|---|---|---|---|
| 4,758,993 A | * | 7/1988 | Takemae | 365/222 |
| 4,882,709 A | * | 11/1989 | Wyland | 365/189.02 |
| 4,984,208 A | * | 1/1991 | Sawada et al. | 365/222 |
| 5,323,352 A | * | 6/1994 | Miyata et al. | 365/222 |
| 6,094,704 A | * | 7/2000 | Martin et al. | 711/105 |

* cited by examiner

Primary Examiner—David Nelms
Assistant Examiner—Connie C. Yoha
(74) Attorney, Agent, or Firm—Marger Johnson & McCollom, P.C.

(57) ABSTRACT

A semiconductor memory device and method for its operation are disclosed. The memory device uses refresh-type memory cells, but operates within the same timing parameters as an SRAM. A refreshing operation and a successful read/write operation can both be performed in a read/write cycle, with zero write recovery time. But if the read/write cycle goes long, multiple refreshing operations can also be performed during the read/write cycle. Thus the device operates with no maximum write cycle time limitation.

In the disclosed method, an external write command causes the device to store the write address and data to registers instead of to the memory cell array. When the external write command signals that data is present, zero write recovery time is needed, since the registers require no address setup time. Because the memory cell array is not involved in this transaction, refresh operations can proceed as needed during the external write command, no matter how long the external write takes to complete. At a convenient time after the end of the external write command (e.g., during the next external write command), a short pulsed write operation transfers the data to the memory cell array.

7 Claims, 12 Drawing Sheets

REFRESH-TYPE MEMORY WITH ZERO WRITE RECOVERY TIME AND NO MAXIMUM CYCLE TIME

This application is a divisional of U.S. patent application No. 09/609,200, filed on Jun. 30, 2000, now pending.

BACKGROUND OF THE INVENTION

1. Field of the Invention

The present invention relates to a semiconductor memory device and method of operation, and more particularly, to a semiconductor memory device and method of operation wherein memory cells require refreshing of storage data, wherein refreshing operations are performed internally, and wherein the device operates externally with timing requirements similar to those of a static RAM.

2. Description of the Related Art

Random-access memory (RAM) devices store electronic data in an array of individually-addressable elements known as memory cells. Two basic types of RAM cells are prevalent in the market—the static RAM (SRAM) cell and the dynamic RAM (DRAM) cell. The SRAM cell has a static latching structure (e.g., comprising six transistors, or four transistors and two registers) that can store data indefinitely. The DRAM cell has a storage node (e.g., a capacitor) and a single access transistor. Data is stored in the cell by setting the charge state of the storage node.

Because all capacitors exhibit charge leakage, a characteristic of the DRAM cell is that it cannot hold data indefinitely. A charged storage node will eventually discharge to a point where it will be misread as a discharged storage node, causing a data error. To prevent this from occurring, DRAM cells are periodically "refreshed", i.e., charged cells are recharged. This periodic refreshing must revisit each cell many times per second to prevent data loss.

DRAM refreshing requires a refresh circuit to ensure that each cell is revisited before data loss occurs. Early DRAMs (particularly DRAMs that operate externally with timing requirements similar to those of a static RAM) relied on an external memory controller to perform the necessary refresh circuit function. Today, many DRAMs incorporate a refresh circuit into their internal logic, and thus perform "internal refreshing". Historically, internal-refresh DRAMs have had different external operating requirements than SRAMs. In particular, prior art internal-refresh DRAMs imposed at least one of two external operating requirements that do not exist with an SRAM: a finite write recovery time that is added to the end of every write cycle, and a maximum write cycle time. As will be explained below, a required write recovery time makes DRAM write access time slower than the normal read access time, and the maximum write cycle time imposes an upper limit on the length of an external write cycle.

Despite its peculiarities, the DRAM has some distinct advantages when compared to the SRAM. Chief among these is size—the DRAM memory cell is typically an order of magnitude smaller than an SRAM memory cell built with similar process technology. This size difference translates into either a less expensive device, or a device that can store more data for the same memory cost. Thus a DRAM that could replace an SRAM without imposing additional external operating requirements on surrounding circuitry is desirable.

U.S. Pat. No. 4,984,208, entitled "Dynamic Read/Write Memory with Improved Refreshing Operation", issued to Kazuhiro Sawada et al. on Jun. 12, 1989, discloses two DRAM circuits, one with a write recovery time requirement, and another with a maximum cycle time requirement.

FIG. 1 illustrates the operation of an internal-refresh DRAM circuit with a write recovery time requirement, as disclosed in the background of the '208 patent. A write operation is shown in FIG. 1 between times t0 and t3. The write operation is initiated externally by setting up the write address on ADD at time t0, and then taking the write enable signal WE# low. After the data to be written is set up on I/O, write enable signal WE# is taken back high at t1, signaling the DRAM circuit that it may now read the data off of I/O. But in FIG. 1, at time t1 the circuit has just begun a refresh operation by selecting a refresh word line RWL. Thus the start of the array write access must be delayed until the end of the refresh operation at t2. At t2, word line NWL1 is finally asserted and the data on I/O is written. The data and address must remain on the input to the device long enough for the refresh to finish and the array write access to begin.

In FIG. 1, the write recovery time t(WR) is the additional time needed after the rising edge of the WE# pulse before another memory operation can be begun. Whereas an SRAM can complete a write operation upon sensing the rising edge of the WE# pulse, this DRAM cannot. This is because the DRAM cannot pre-select the word line NWL1 before data is available on I/O, in order that refresh operations can occur in the interim. FIG. 1 shows the worst case that must be designed for, where a refresh operation has just begun when WE# goes high.

FIG. 2 illustrates the operation of a second DRAM described in the '208 patent. In FIG. 2, when WE# goes low, a refresh operation has already begun (RWL is selected). When the refresh operation ends, the word line NWL1, corresponding to the address on ADD, is selected, and remains selected for the duration of the WE# pulse. Thus when the data becomes valid on I/O, it can immediately be written, allowing the write operation to end and another operation to begin when WE# goes back high. Thus the operation in FIG. 2 requires no write recovery time, and appears to have the same timing as an SRAM.

As illustrated in FIG. 3, the operation of the second DRAM poses a potential problem that is not present with an SRAM. Because NWL1 remains selected for the write enable pulse duration t(WP), a refreshing operation cannot begin while WE# is low. Thus it the external circuitry initiates a "long write", i.e., it waits too long to release WE#, this may delay a refreshing operation too long to prevent data corruption.

To prevent data corruption, a DRAM operating according to FIGS. 2 and 3 imposes a maximum write cycle time on external circuitry. In other words, t(WP) may be limited, e.g., from one to ten microseconds in duration for each write cycle. This limits the applications for such a device to those that can both tolerate and ensure compliance with a maximum write cycle time requirement.

SUMMARY OF THE INVENTION

It has now been recognized that a need exists for a memory device that uses refresh type memory cells, but operates within the same timing parameters as an SRAM. The preferred embodiments of the present invention accomplish just this, by operating with a zero write recovery time and also with no maximum write cycle time limitation. In these preferred embodiments, a refresh operation and a successful read/write operation can both be performed during an external read/write cycle, with zero write recovery time. But if the read/write cycle goes long, multiple refresh operations can also be performed during the single cycle. Since refreshing can continue during a long external read/write cycle, no limitation on maximum cycle time is necessary with the preferred embodiments.

A method for operating a semiconductor memory device having a refresh-type memory cell array is disclosed. In this method, an external write command causes the device to store the write address and data to registers instead of to the memory cell array. Consequently, the method does not require the word lines of the memory cell array to be statically-enabled, during the external write command, in order for the device to respond to that command. This allows refresh operations to proceed as needed during the external write command, no matter how long the external write takes to complete.

In some preferred embodiments, an external write command also triggers a pulsed late write to the memory cell array of the register data associated with the last external write command. This frees the registers so that they can be used to store the write address and data associated with the current external write command. But perhaps more importantly, because the late write is pulsed, with its timing controlled by the device, the write occupies a known time period to access the memory cell array—no matter what the length of the external write cycle. Outside of this known time period, refresh operations can be allowed.

A semiconductor memory device having a refresh-type memory cell array is also disclosed. The device comprises a refresh circuit, a data input register, a write address register, write circuitry, read circuitry, and control circuitry. The write circuitry initiates a pulsed write operation during an externally-requested current write operation, in order to write data stored in the data input register to the cell array at an address stored in the write address register. The write circuitry also stores the write address received during the current externally-requested write operation to the write address register, and stores the data received during the current externally-requested write operation to the data input register.

The read circuitry initiates a pulsed read operation during an externally-requested current read operation. The read address for the read operation is compared to the address stored in the write address register. When these two addresses are different, data read from the memory cell array is selected for output. When the two addresses match, however, data from the data input register is selected for output.

The control circuitry generates timing signals for pulsed write operation, pulsed read operation, and pulsed refresh operation. The control circuit also disables refresh operation.requests from the refresh circuit during pulsed write operations and pulsed read operations.

BRIEF DESCRIPTION OF THE DRAWINGS

The present invention may be best understood by reading the disclosure with reference to the drawing, wherein.

DETAILED DESCRIPTION OF THE EMBODIMENTS

Figure 1:
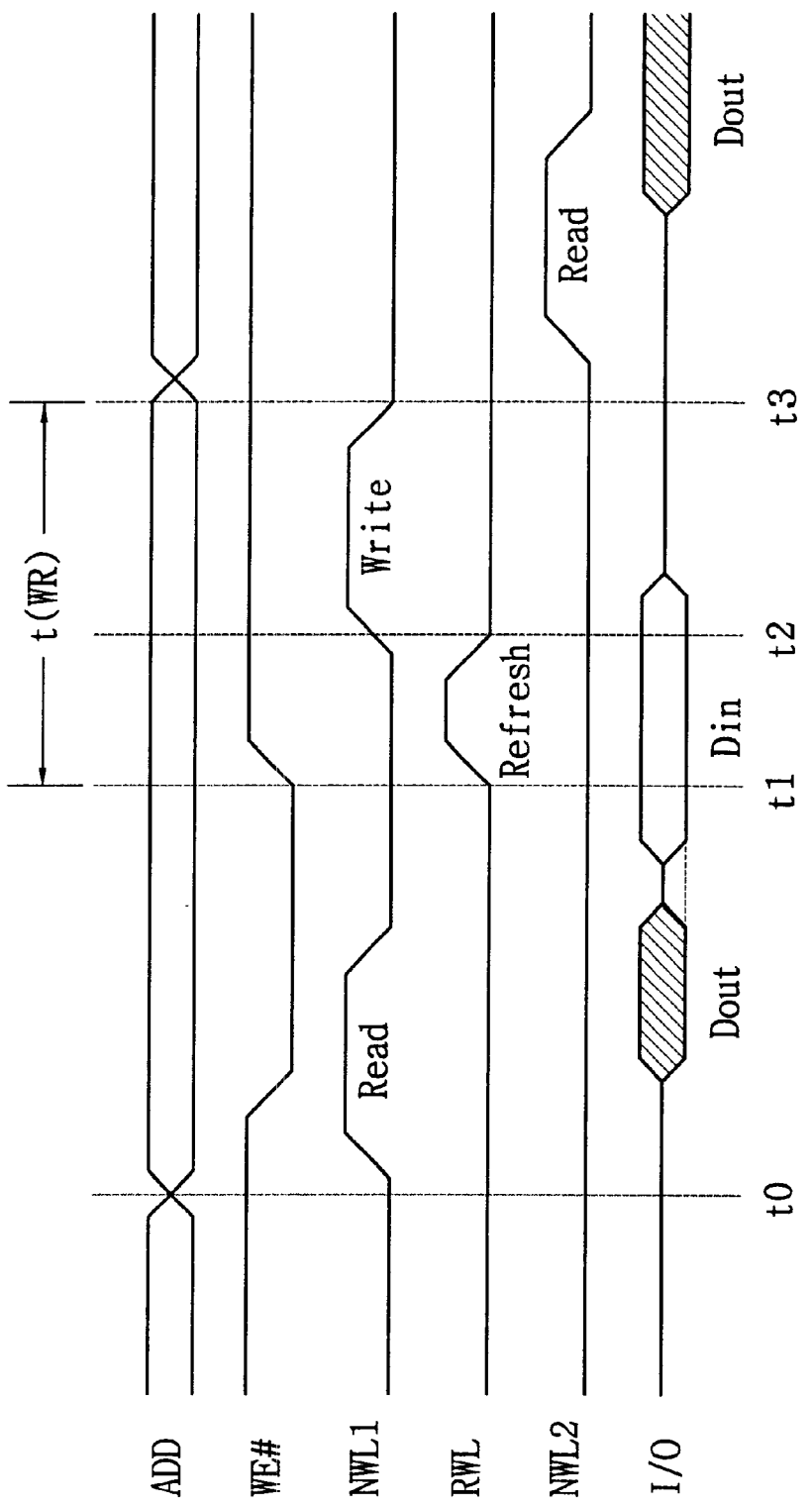
FIGS. 1, 2, and 3 are timing charts for prior art DRAM operation.
Figure 2:
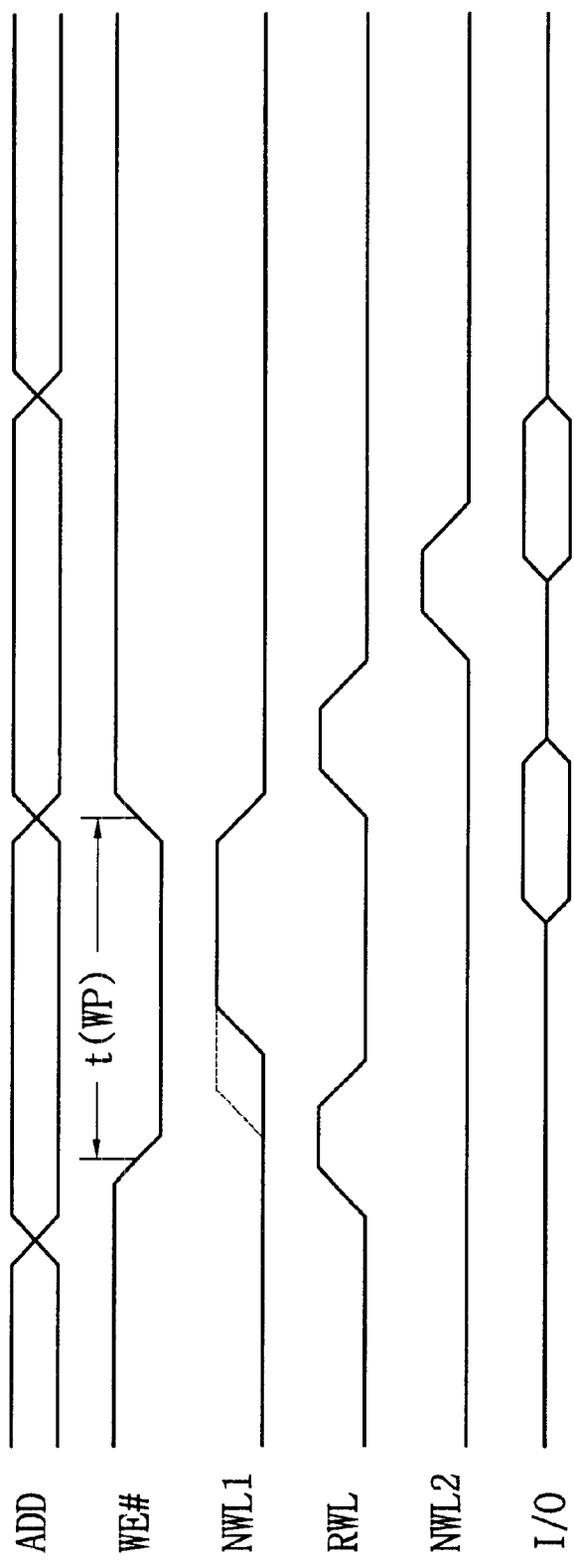
Figure 3:
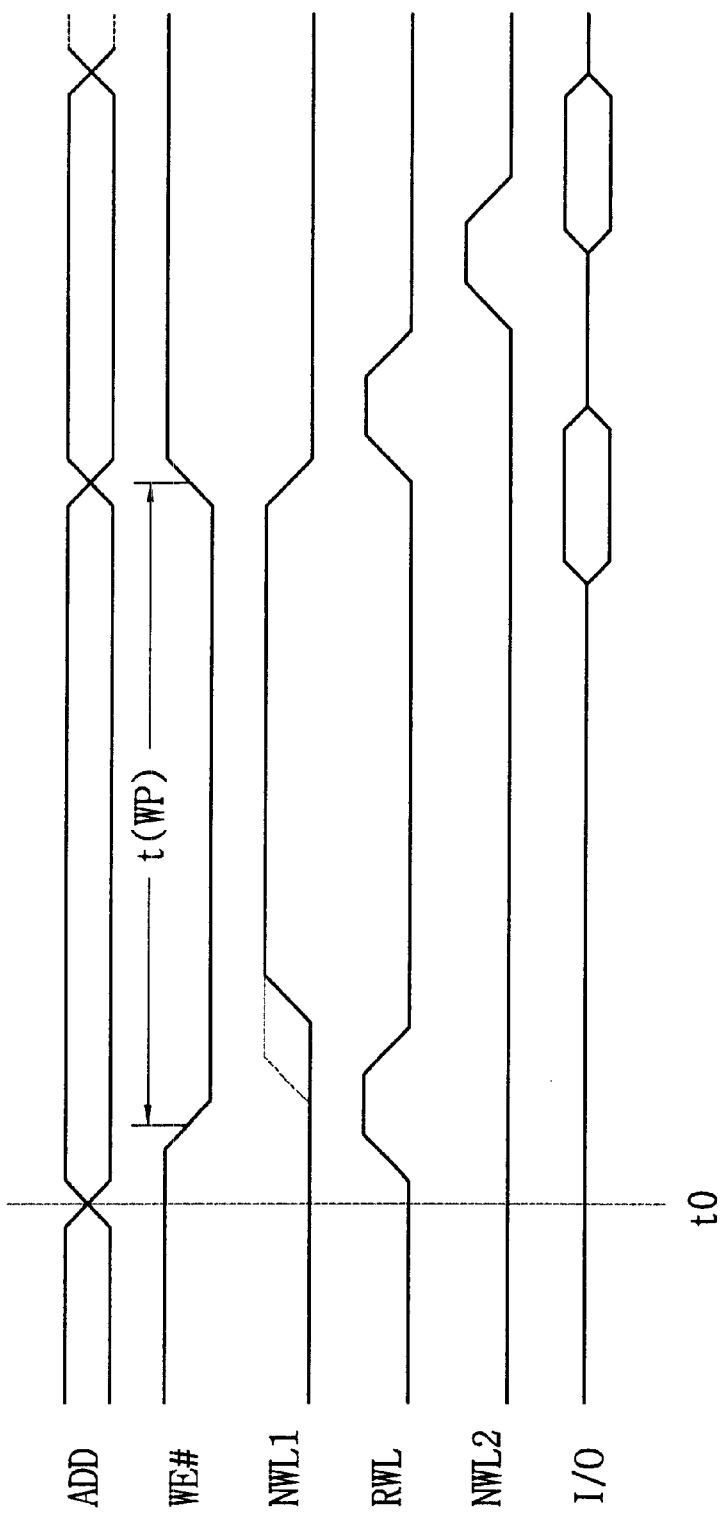

In the following description, several terms have defined meanings. A pulsed operation, such as a pulsed read or a pulsed write, refers to an operation that is internally sequenced, as opposed to an operation that begins and ends based upon transitions of an external signal. For example, a pulsed write operation may begin based upon an internal or external start signal, but the operation then proceeds according to internally-generated signals.

A late write refers to an internal pulsed write operation to the memory cell array. The distinguishing feature of a late write is that array address setup and data writing occur at some time after the external write operation during which the address and data were supplied to the device, with the external write address and data stored in temporary registers in the interim. The late write may occur, e.g., during a following external write operation. Another feature of a late write is the possibility that a request to read the data may occur before the device actually writes the data to the array.

Turning now to a first embodiment of the invention. FIGS. 4 A/B contain a block diagram of a semiconductor memory device 90.

In device 90, memory cell array 200 comprises refresh memory cells, word lines WL, and bit lines BL. Each memory cell is coupled to one word line and one bit line. Row decoder 140 and column decoder 150 provide a means for addressing a particular memory cell. During an access, the bit lines BL are pre-charged, and then row decoder 140 selects a word line based on a row address signal when main pulse generator 320 generates a pulse on PWLb. The selected word line turns on the access transistor in each memory cell connected to that line, allowing charge sharing between each memory cell's storage node and the particular one of the bit lines BL connected to that memory cell. Sense amplifiers 410 are then activated by a pulse on PSA; each sense amplifier senses whether the memory cell currently coupled to its particular bit line was charged or discharged, by measuring the voltage on the bit line. This signal is amplified, thereby refreshing the memory cell.

During a read or write operation, one or more cells are then read or written to. Column decoder 150 selects a column select line CSL, based on a column address signal, when main pulse generator generates a pulse on PCSL. Each column select line couples one or more corresponding bit lines to the input/output circuitry of device 90, allowing reading and writing to the memory cells coupled to the selected word line.

External memory accesses to device 90 are initiated by read and write commands. These commands can be initiated, e.g., by signal transitions on one or more of the external inputs for address ADDi, chip enable (also called chip select) CE#, and write enable WE#. For instance, a read command can be initiated by a new address appearing on ADDi, or by asserting CE# (with WE# deasserted in both cases). Likewise, a write command can be initiated in several ways. One common way is to assert WE# while CE# is asserted. Similarly, if CE# is asserted while WE# is asserted, a write command is initiated. Finally, with both CE# and WE# asserted, a new write command can be initiated by an address transition on ADDi. Although the claims are intended to cover these, as well as other common methods of initiating read and write commands, the examples that follow use only one read and one write command method, in order to simplify the disclosure.

Address buffer circuit 100 receives and buffers the external signals ADDi and CE#. When one of these signals changes (and the final state of CE# is enabled), ATD (Address Transition Detector) circuit 330 responds to the ADDi or CE# transition and generates a short pulse PATD.

Write enable buffer circuit 300 receives and buffers the external signals WE# and CE#. WE# is supplied to read/write pulse control circuit 310 as buffer signal WEb. When one of CE# and WE# transitions to asserted, and the other is already asserted, write enable buffer circuit 300 generates a pulse SPGL_WE. When WE# transitions to deasserted, write enable buffer circuit 300 generates a pulse SPGH_WE.

Read/write pulse control circuit 310 generates internal control signals that operate multiplexer 130, main pulse generator 320, and refresh control circuit 510. The inputs to control circuit 310 are PATD, WEb, SPGL_WE and SPGH_WE, and PRFH (a refresh pulse generated by refresh control circuit 510). Control circuit 310 generates a refresh selecting signal RFHTD in the refresh cycle, a read selecting signal RATD in the read cycle, and a write selecting signal PWTD in the write cycle. Additionally, control circuit 310 generates a refresh request operation blocking signal NERFH to control refresh control circuit 510 whenever refreshes are not allowed.

Multiplexer 130 uses the signals RATD, PWTD, and RFHTD to select one of three possible address signals as the input address Ai to row decoder 140 and column decoder 150. The first of the three address signals is internal address Ai_R—when a new address is received on external address lines ADDi, address buffer circuit 100 stores the address and outputs it as Ai_R, whether the address corresponds to a read command or to a write command. The second of the three address signals is write address Ai_W. Write address register 110 stores Ai_R during a write cycle, and then outputs the stored value as Ai_W until a different value is stored during the following write cycle. The third address signal is refresh address Ai_cnt. Generally, multiplexer 130 selects Ai_R during a pulsed read of array 200, selects Ai_W during a pulsed write of array 200, and selects Ai_cnt during a pulsed refresh of array 200.

The refresh circuitry of device 90 comprises refresh timer 500, refresh control circuit 510, refresh address counter 520, and read/write pulse control circuit 310.

Refresh timer 500 generates a pulse on refresh request line SRFHB, e.g., at fixed time intervals. The interval duration is intended to ensure a refresh rate that prevents data loss.

Refresh control circuit 510 receives an SRFHB pulse when NERFH is deasserted. When NERFH is asserted, refresh control circuit 510 does not receive the SRFHB pulse.

Refresh address counter 520 steps through addresses in a manner that addresses each word line and column select line in a predetermined sequence. Refresh address counter 520 changes its output Ai_cnt when PRFH is pulsed.

Read/write pulse control circuit generates refresh control signals RFHTD and NERFH in response to its inputs. RFHTD initiates a refresh operation. NERFH disables refresh operation requests during pulsed read operations and pulsed write operations.

Semiconductor memory device 90 also contains circuitry to correctly process late writes, including the write address register 110, comparator 120, bypass control circuit 160, data input register 440, and data output multiplexer 430. Write address register 110 stores the value of Ai_R based on a pulsed signal on SPGH_WE (i.e., the end of an external write cycle). At the same time (and also based on SPGH_WE), data input register 440 stores the data input information currently in data input buffer 460. Registers 110 and 440 output these stored values constantly, until they are replaced on the next SPGH_WE pulse.

When an external write command is initiated, a late write of the data in data input register 440 is performed before the current external write command completes. This late write stores, to memory cell array 200, the data Din_W that was input to data input register 440 during the last external write command, at an array address corresponding to the write address Ai_W that was input to the device during the last external write command. Then, at the end of the current external write command, when SPGH_WE is pulsed, the pulse operates write address register 110 and data input register 440 (causing them to store, respectively, the current write address and current data input information).

Device 90 must be able to read back out, upon demand, any data that has been externally written to device 90, including late write data. Comparator 120 compares the write address register contents (Ai_W) to the currently requested read address (Ai_R). When they match, this indicates that an external read operation has requested data that has not yet been stored in memory cell array 200 (but which is stored temporarily in data input register 440). Comparator 120 therefore asserts Add_comp to bypass control circuit 160. Bypass control circuit 160 asserts the BYPASS signal when Add_comp is asserted and the pulsed bypass enable PBYPASS is also asserted. The BYPASS signal causes data output multiplexer 430 to select for output (to output data buffer 450) the data stored in data input register 440, instead of the data retrieved from memory cell array 200 (which, in this embodiment, was also retrieved but is outdated). For all other read addresses, the comparator generates no match, and the data appearing in output data buffer 450 is the data retrieved from cell array 200.

Figure 5:
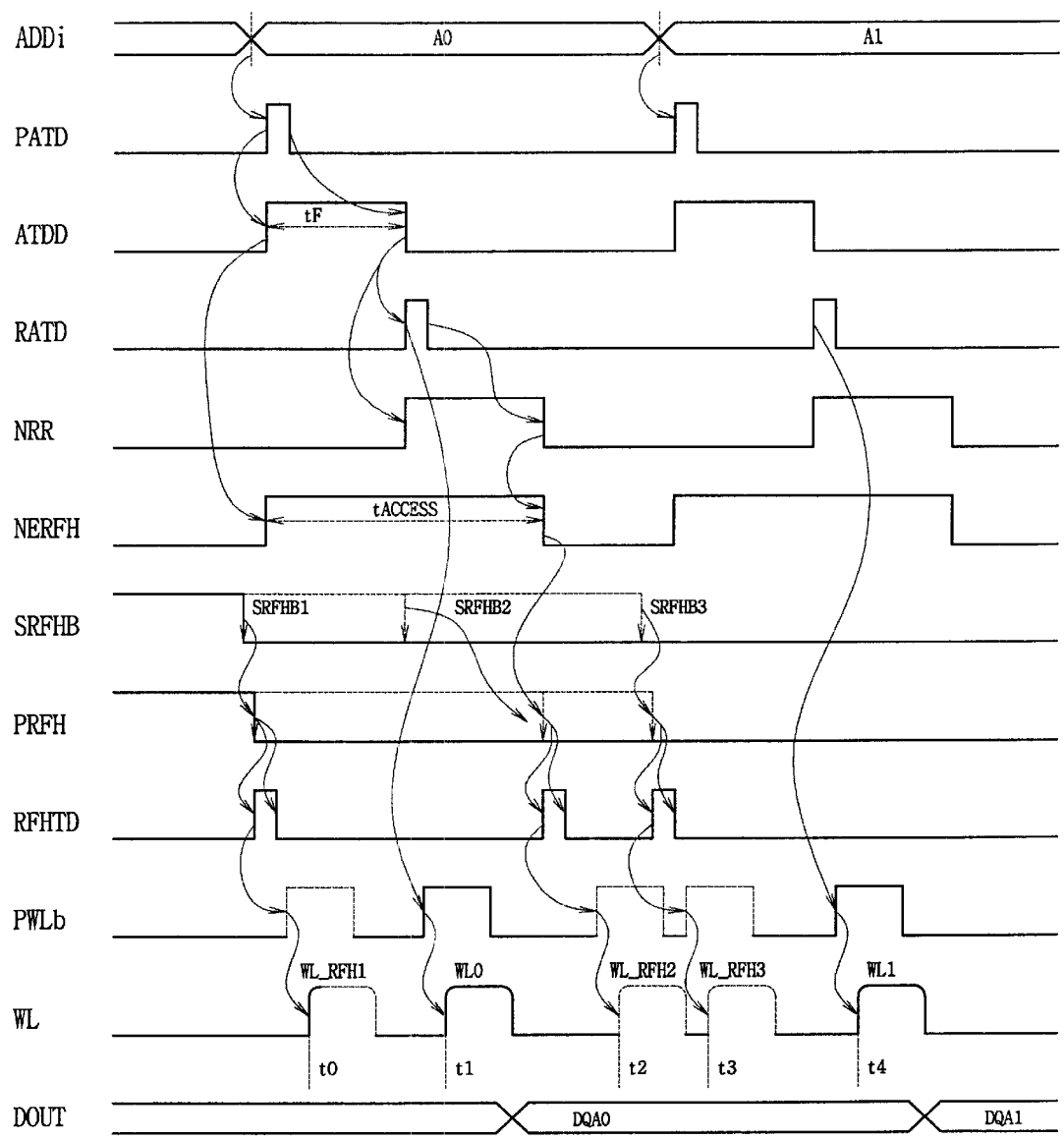
FIG. 5 is a timing chart illustrating a read operation in an embodiment of the present invention.
Figure 6:
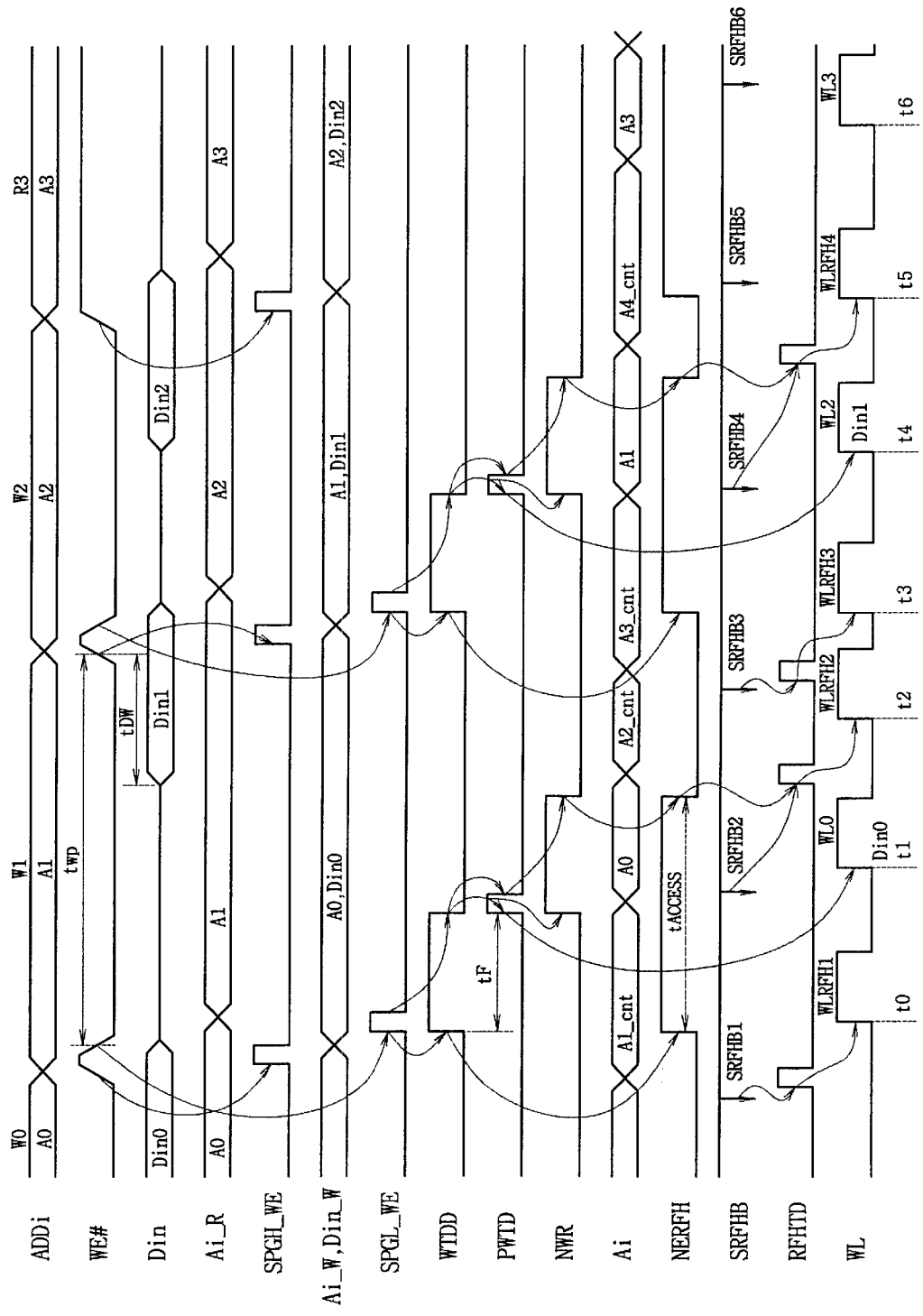
FIG. 6 is a timing chart illustrating a write operation in an embodiment of the present invention.
Figure 7:
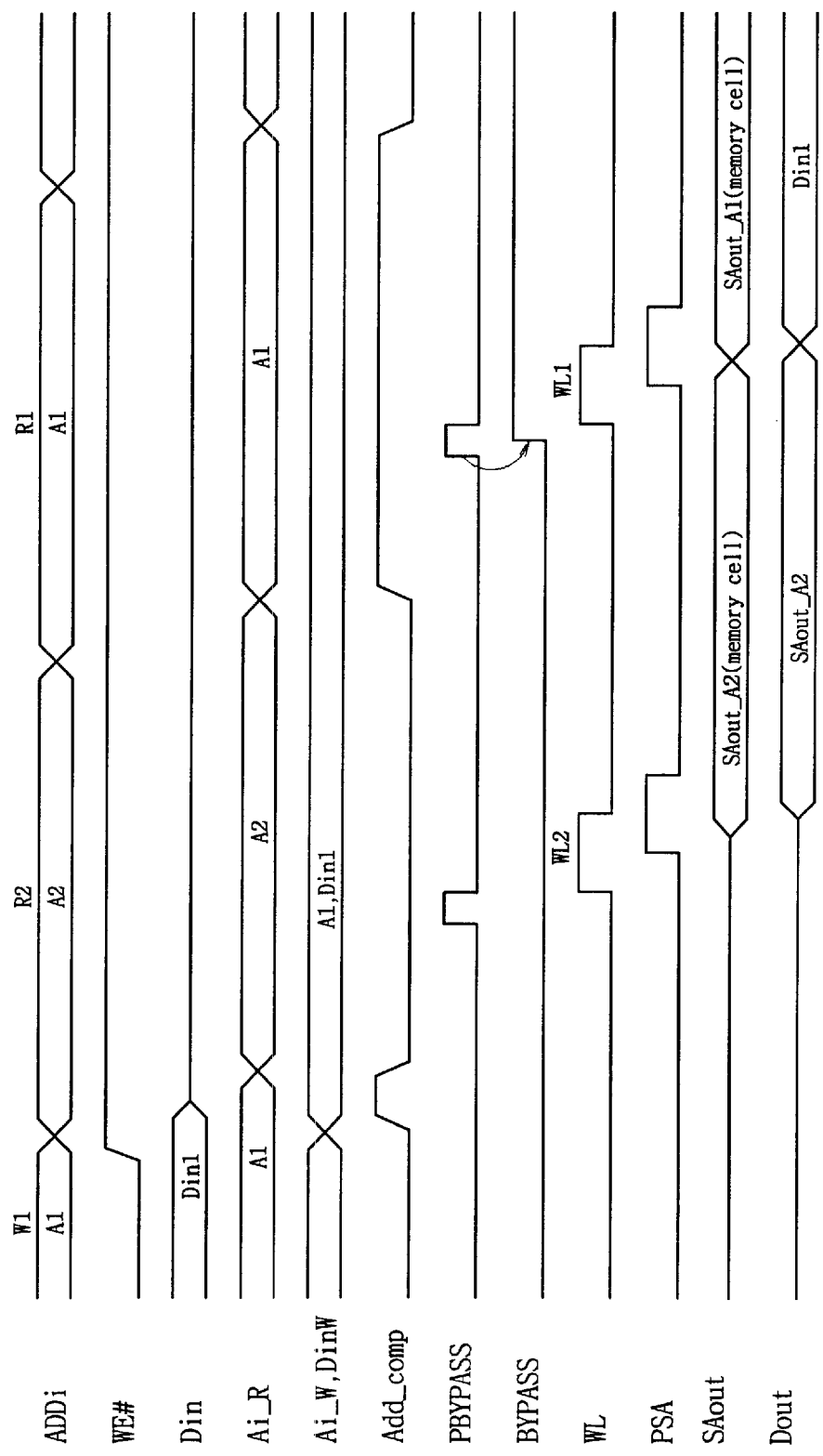
FIG. 7 is a timing chart illustrating a bypass read operation in an embodiment of the present invention.

FIG. 5 contains a timing chart that illustrates normal read operation, FIG. 6 contains a timing chart that illustrates normal write operation, and FIG. 7 contains a timing chart that illustrates a bypass read operation. Each will be explained in turn.

Referring first to FIG. 5, a change in ADDi (to address A0) triggers a pulsed read operation. The ATD circuit generates a short pulse on PATD. Within the read/write pulse control circuit, a pulse spreader responds to the PATD pulse by generating a length tF pulse on ATDD. The pulse on ATDD, otherwise known as a "dummy refresh", provides a time interval during which a pending refresh operation an be completed in the normal read cycle. The ATDD pulse also asserts NERFH, preventing new refresh operations from being requested.

At the end of the dummy refresh pulse, a short pulse is generated on RATD to initiate a pulsed read operation. This pulse selects Ai_R (which contains the address A0) as the output address Ai of the address multiplexer. The RATD pulse also initiates array addressing pulses (PWLb is shown) for a read access, resulting in WL0 being selected for a predetermined pulse width starting at t1. The pulsed read operation completes shortly thereafter when data DQA0 is output from the data output buffer.

During the pulsed read operation, within the read/write pulse control circuit, a pulse spreader responds to the end of the dummy refresh pulse by generating a normal read request (NRR) pulse. The NRR pulse provides sufficient time for the pulsed read operation to complete. At the end of the NRR pulse, NERFH is deasserted, and refresh requests are allowed. Note that the interval during which refreshes are disabled has a duration tACCESS, equal to the combined lengths of the dummy refresh pulse and the normal read request pulse.

Also shown in FIG. 5 are three timed refresh request signals on SRFHB: SRFHB1, which occurs just prior to the transition of ADDi to value A0; SRFHB2, which occurs while NERFH is asserted; and SRFHB3, which occurs during the same external read cycle, but after the pulsed read operation has completed.

Refresh request signal SRFHB1 is received by the refresh control circuit just before ADDi transitions to A0. Thus PRFH is asserted, initiating a pulsed refresh operation by triggering a pulse on RFHTD. This pulse selects Ai_cnt, which addresses the current refresh word line, as the output address Ai of the address multiplexer. The RFHTD pulse also initiates a word line selecting pulse on PWLb, resulting in WL_RFH1 being selected for a predetermined pulse width starting at t0. As shown in FIG. 5, the word line selecting pulse for WL_RFH1 ends well within the dummy refresh time.

Refresh request signal SRFHB2 is received by the refresh control circuit while NERFH is asserted (during the tACCESS interval). The refresh control circuit thus delays asserting PRFH in response to SRFHB2 until NERFH is deasserted to signal the end of the pulsed read operation. Upon deassertion of NERFH, a pulsed refresh operation for word line WL_RFH2 is initiated and the refresh occurs at t2, in similar fashion to the refresh of word line WL_RFH1 at t0.

Refresh request signal SRFHB3 is received by the refresh control circuit near the end of the read from address A0. The refresh control circuit is not blocked by NERFH, and therefore initiates a third pulsed refresh operation. Word line WL_RFH3 is refreshed at t3, during a pulsed refresh that extends partially into the next (A1) external read cycle.

The preceding pulsed read operation allows at least one refresh to occur during each normal read operation (during the dummy refresh time). Also, as shown, no problem arises in relation to a long external read cycle time, because the refreshing operation is re-enabled after a pulsed normal read access to the word line, even in a long read cycle.

Turning now to FIG. 6, timing for two successive external write operations W1 and W2, followed by a read operation R3, is shown. Note that as the timing chart begins, an external write operation W0 is just ending.

External write operation W1 begins with a transition on ADD to address A1, and a corresponding low transition on write enable WE#. Note that just prior to this, a high transition on WE# signaled the end of external write operation W0, triggering a pulse on SPGH_WE. This pulse caused Ai_W to store A0 from Ai_R, and Din to store Din0.

The beginning of external write operation W1 triggers a pulsed write operation to write Din0 to the cell array at an address corresponding to A0. The low transition on WE# triggers a pulse on SPGL_WE. The read/write pulse control circuit responds to this pulse by generating a spread pulse WTDD for a dummy refresh interval, similar to the dummy refresh interval of the preceding example.

At the end of the dummy refresh interval, the read/write pulse control circuit generates a short pulse on PWTD and a spread pulse on NWR. The end point of the spread pulse defines the end point of the pulsed write command. The PWTD pulse causes the address multiplexer to select Ai_W (i.e., the value A0 in this example) as the address Ai to the row and column decoders. The PWTD pulse also initiates a write pulse sequence in the main pulse generator, causing word line WL0 to be selected at time t1. During the time WL0 is selected, Din0 is written to the data array from Din_W.

Once the pulsed write cycle is finished, the device can resume refresh operations until an external signal (e.g., the high transition of WE#) signals the end of the external write cycle. At the high transition, a pulse on SPGH_WE stores A1 and Din1, causing these values to appear respectively on Ai_W and Din_W. External write cycle W2 immediately follows external write cycle. The processing for W2 is similar to the processing for W1, and contains a pulsed write operation to store A1 into the memory cell array.

A read cycle R3 immediately follows W2, illustrating that no write recovery time is needed. Read cycle R3 proceeds as did the read cycles in FIG. 5. One additional point worth noting is that Ai_W and Din_W hold their information (i.e., A2 and Din2) through and past external read cycle R3, and will do so into the next write cycle, according to this embodiment.

Refresh operation in FIG. 6 is similar to that already described with reference to FIG. 5. Thus no maximum write cycle time need be specified, as it can be seen that refreshes can occur within the normal external write cycle, no matter what its length (of course a minimum cycle time exists, as it does for all memory devices).

FIG. 7 contains a timing diagram for a bypass read operation. A bypass read occurs when an external read requests information that has not yet been stored in the memory cell array, as that data is waiting for an appropriately-timed late write. Since the data cannot be read from the memory cell array (yet), the bypass read identifies the data as existing in a data input register, and the data input register information is fed back to the data output, effectively "bypassing" the memory cell array.

FIG. 7 shows some of the same signals as FIG. 6 for the end of an external write cycle W1. In FIG. 7, however, two external read cycles R2 and R1 follow W1. The external read cycle R1 turns out to require a bypass read, as the data from external write cycle W1 (with the same array address A1) has not yet been written to the memory cell array. Although refresh operations have been omitted from FIG. 7 for clarity, it is to be understood that refresh operations would likely also address word lines WL during the time interval shown in FIG. 7.

Read cycle R2 is similar to the read timing diagrams that have been previously explained. Read cycle R2 shows that data SAout_A2 is sensed from the memory cell(s) corresponding to A2 and output on sense amplifier output SAout, and then selected to Dout since BYPASS is disabled.

Read cycle R1 operates somewhat differently. Note that once A1 appears on Ai_R during cycle R1, a comparison of Ai_R and Ai_W evaluates true, causing Add_comp to go high. Thus when the bypass pulse on PBYPASS during R1 causes the bypass control circuit to examine Add_comp, the circuit asserts BYPASS to the data output multiplexer. This causes the multiplexer to select DinW, rather than SAout, after the pulsed read operation of external read cycle R1. This produces the correct result, as data Din1 is waiting at DinW to be written to A1, and is thus the latest write data corresponding to address A1.

Figure 8:
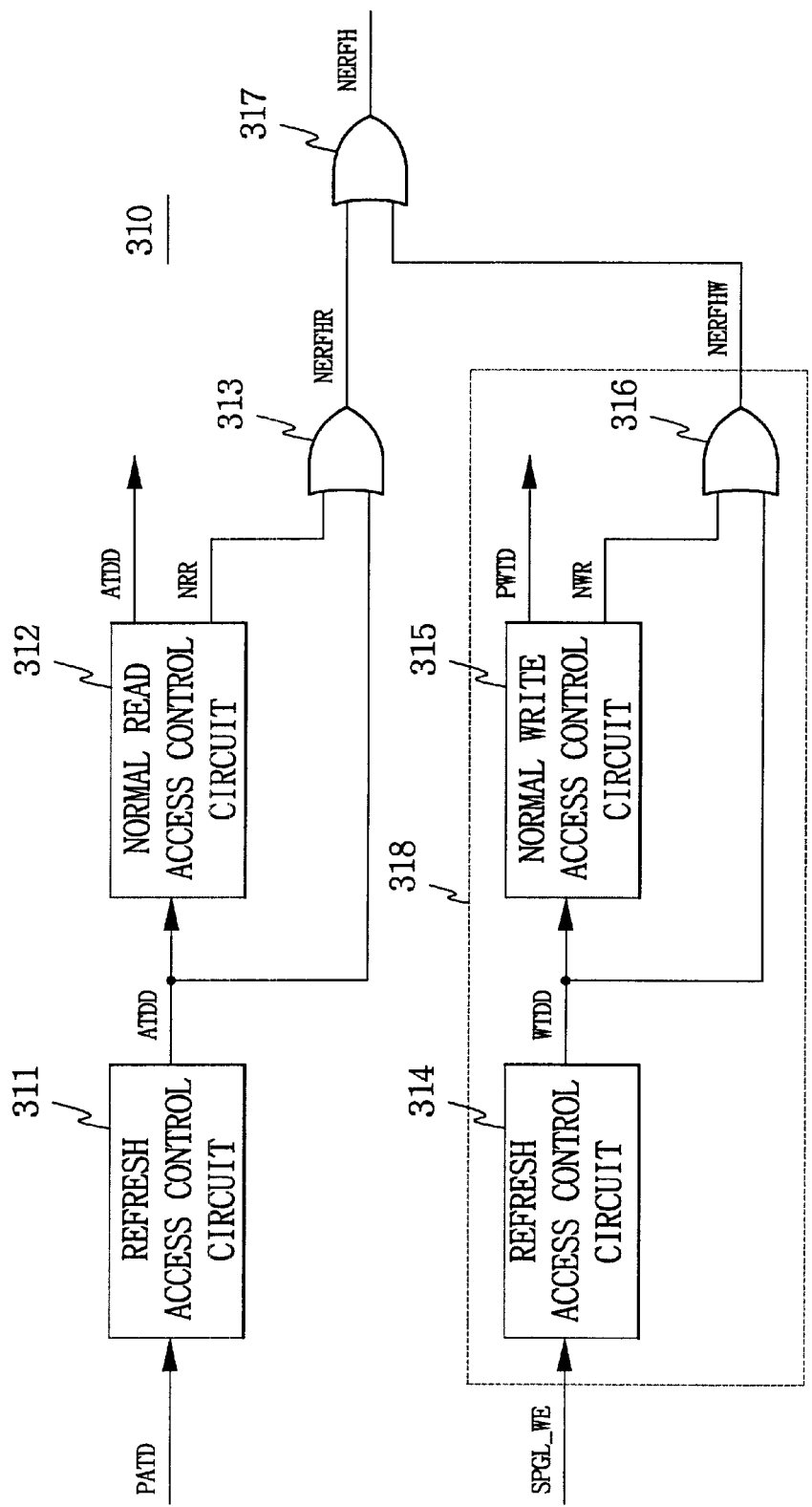
FIG. 8 contains a block diagram for a read/write pulse control circuit useful in an embodiment of the invention.

FIG. 8 contains a block diagram for one embodiment of read/write pulse control circuit 310 (see FIG. 4). This particular embodiment triggers pulsed read operations off of PATD and pulsed write operations off of SPGL_WE.

The upper half of circuit 310 functions during read operations. Refresh access control 311 contains a pulse spreader—the pulse spreader spreads a PATD pulse to generate a dummy refresh pulse on ATDD. ATDD connects as the input to normal read access control 312. Block 312 responds to the trailing edge of a dummy refresh pulse by generating two pulses—a short pulse on RATD to initiate an array read, and a longer pulse on NRR to block refresh operations during the array read. OR gate 313 combines ATDD and NRR to generate a signal NERFHR. NERFHR thus lasts for the combined duration of the ATDD and NRR pulses (i.e., the pulsed read access time tACCESS).

The lower half of circuit 310 functions during write operations. Refresh access control 314 contains a pulse spreader to spread a SPGL_WE pulse, thereby generating a dummy refresh pulse on WTDD. WTDD connects as the input to normal write access control 315. Block 315 responds to the trailing edge of a dummy refresh pulse by generating two pulses—a short pulse on PWTD to initiate an array write, and a longer pulse on NWR to block refresh operations during the array write. OR gate 316 combines WTDD and NWR to generate a signal NERFHW. NERFHW thus lasts for the combined duration of the WTDD and NWR pulses (in this embodiment, the pulsed write access time, also tACCESS).

NERFHR and NERFHW are combined by OR gate 317 to create the signal NERFH. NERFH is the refresh request blocking signal, which is active during pulsed read operations and pulsed write operations.

FIG. 8 uses a fixed pulse length for WTDD. An alternate embodiment uses a variable pulse length, with a maximum duration equal to the dummy refresh pulse duration, and a minimum duration approaching zero. This embodiment allows a pulsed write to be performed earlier in an external write command, when conditions permit.

The variable pulse length for WTDD is computed by triggering the trailing edge of the pulse on a signal that relates to the status of any executing refresh operation. This signal could be, for instance, a pulse equal in length to a dummy refresh pulse, but triggered by PRFH each time a refresh operation begins.

Figure 9:
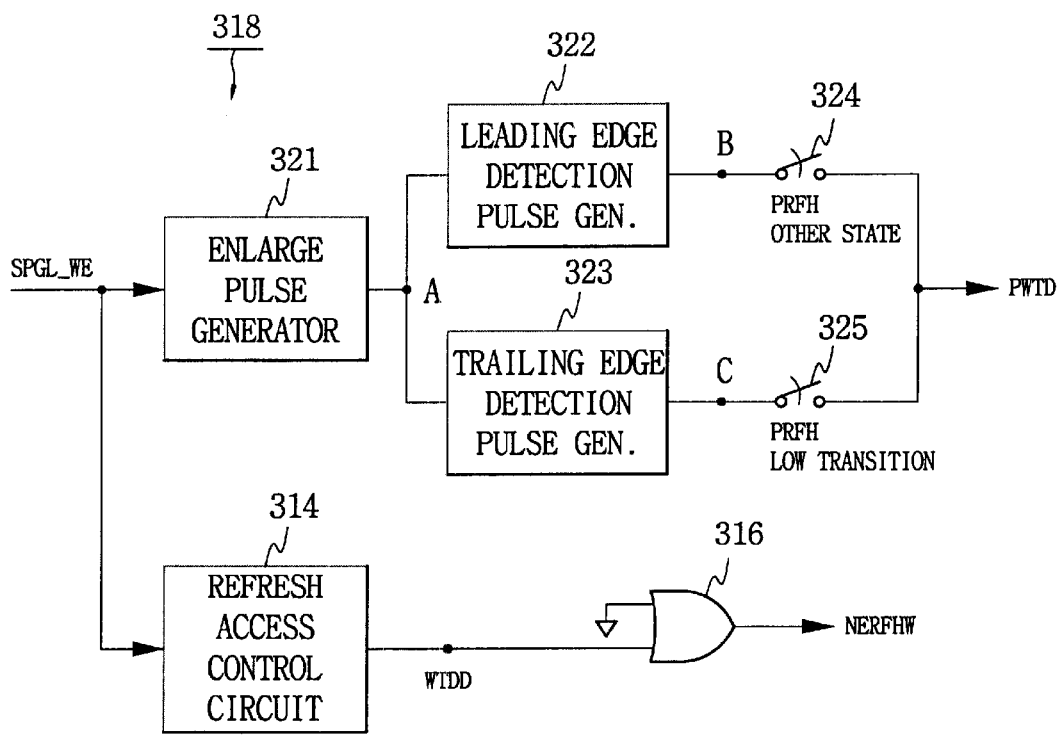
FIG. 9 contains a block diagram for an alternate design for one part of the circuit of FIG. 8.
Figure 9:
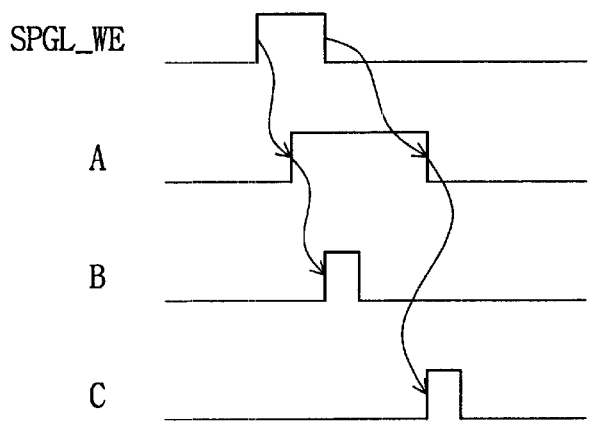

FIG. 9 shows an alternative implementation 318 that can replace normal write access control circuit 315 of FIG. 8. The circuit of FIG. 9 varies the timing of the pulsed write operation, depending on whether or not a refresh operation is in progress at the start of an external write operation. This allows the late write operation to execute as early in the external write cycle as possible in such cases, freeing the array access logic earlier in the external write cycle to perform refreshes (as well as freeing the write address and data input registers earlier).

The circuit of FIG. 9 operates as follows. Enlarge pulse generator 321 forms a spread pulse A (approximately the length of the dummy refresh time) when an 3SPGL_WE pulse is received. Leading edge pulse generator 322 triggers a short pulse B off of the leading edge of spread pulse A. Trailing edge pulse generator 323 triggers a short pulse C off of the trailing edge of spread pulse A. One of pulses B and C will be used as a PWTD pulse, depending on the state of switches 324 and 325.

Switch 325 is closed and switch 324 is opened when the PRFH signal transitions to low (i.e., at the beginning of a refresh operation). Thus once a refresh operation has begun, signal C will become PWTD at the end of a dummy refresh time after SPGL_WE is asserted.

When PRFH signal state is others (no refresh operation) and SPGL_WE is asserted, switch 324 is closed and switch 325 is opened. Thus signal B will become PWTD and the dummy refresh time is avoided.

Switches 324 and 325 are not allowed to change position while NERFHW is asserted.

Figure 10A:
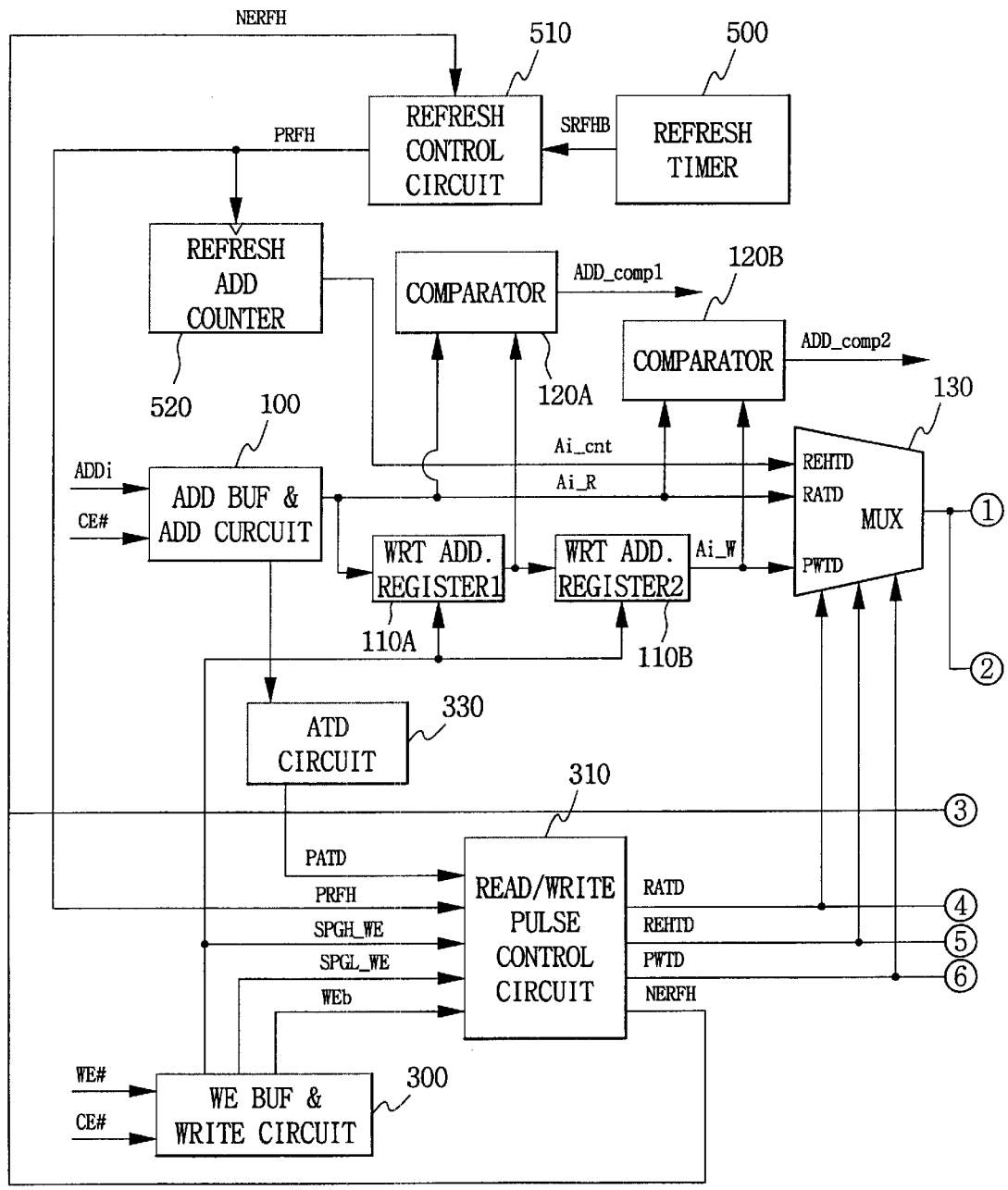
FIG. 10 A/B contain a block diagram for an alternate embodiment of the invention.
Figure 10B:
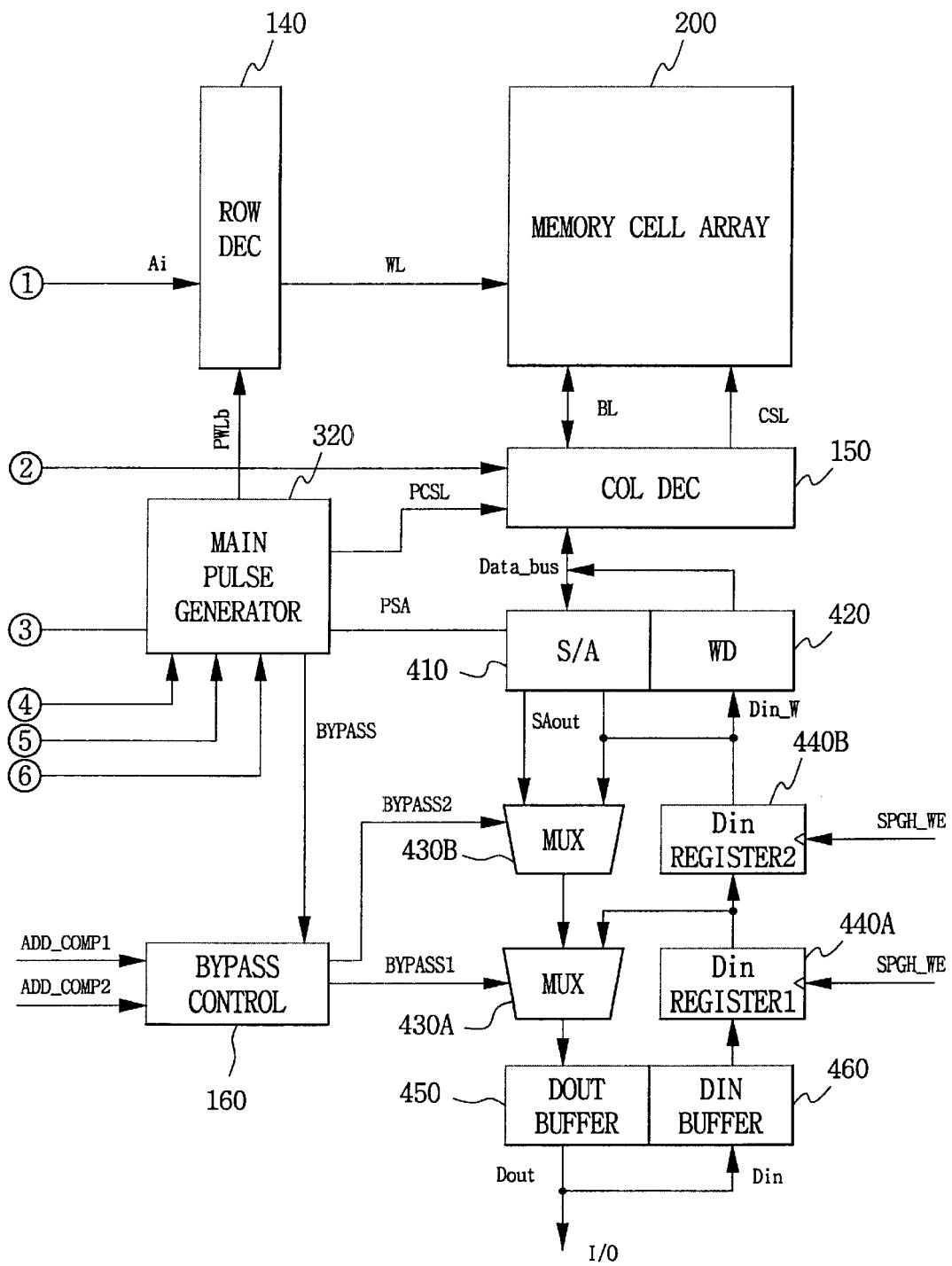

FIGS. 10 A/B show an alternate embodiment of the invention that uses multistage registers. Write address register stages 110A and 110B are connected serially, such that the lower-order stage (110A) supplies input to the following stage (110B) thus an external write address is delayed for two write cycles before it is used to write to the memory cell array 200. Likewise, data input register stages 440A and 440B are connected in serial fashion, such that input data is also delayed for two write cycles before it is written to memory cell array 200, After any given external write command, the last two sets of input data are waiting to be stored to memory cell array 200.

The alternate embodiment shown in FIGS. 10A/B somewhat complicates bypass read operation. Two comparator stages 120A and 140B are used, one for each write address register stage. Each comparator stage compares Ai_R with the address stored in its assigned register stage, to produce signals Add_comp1 (stage 120A) and Add_comp2 (stage 120B). A two-stage data output multiplexer 430A, 430B selects either Saout, Din_W2, or Din_W1 as the output data for a pulsed read operation. Although the data output multiplexer is shown as a two-stage multiplexer, it could also be implemented with a single three-input multiplexer.

One of ordinary skill in the art will recognize that the concepts taught herein can be tailored to a particular application in many other ways. Although late writing during subsequent external write cycles will typically require somewhat simpler logic, it is also possible to schedule a pulsed late write operation during an external read operation. The variable-duration dummy refresh pulse concept discussed for write operation can be employed during read operation as well. The particular method in which the memory cell array is laid out and accessed is not critical to the invention, nor is the particular method employed to operate the refresh circuitry. It is also recognized that the disclosed internal timing signals represent some possible methods of operation according to the invention, with many obvious departures from the disclosed methods, some perhaps even more efficient, available to the circuit designer. Such implementation details are encompassed within the invention, and are intended to fall within the scope of the claims.

The preceding embodiments are exemplary. Although the specification may refer to "an", "one", "another", or "some" embodiment(s) in several locations, this does not necessarily mean that each such reference is to the same embodiment(s), or that the feature only applies to a single embodiment.

What is claimed is:

1. A semiconductor memory device having a memory cell array comprising memory cells requiring refreshing of storage data, the semiconductor memory device comprising:

a control circuit to generate a refresh blocking signal during an access subinterval of each external read or write operation while the device performs a pulsed access of the memory cell array, and to otherwise respond to refresh operation requests by generating refresh operation signals; and a late write circuit to write data received during a previous external write operation to the memory cell array during the access subinterval of a current write operation, and to store data received during a current write operation until a following write operation.

2. The semiconductor memory device of claim 1, wherein the refresh blocking signal delays refresh operation requests received during an access subinterval until after the end of the access subinterval.

3. The semiconductor memory device of claim 1, wherein the duration of the access subinterval is determined as the sum of an approximate refresh access time required for one pulsed refresh operation and an approximate read/write access time required for one pulsed access of the memory cell array.

4. The semiconductor memory device of claim 1, wherein the refresh blocking signal is generated upon detecting a transition of an external read command signal during an external read and also upon detecting a transition of an external write command signal during an external write operation.

5. The semiconductor memory device of claim 4, wherein the transition of the external write command signal is an event indicated by one or more of a transition of an external write enable signal while the device is selected, a transition of an external chip select signal while the external write enable is asserted, and a transition of an external address signal while the device is both selected and write-enabled.

6. The semiconductor memory device of claim 4, wherein a refresh operation is enabled when a refresh operation request is input prior to transition of an external read/write command signal, and disabled for a set period of time when the refresh operation request is input during a read/write access subinterval.

7. The semiconductor memory device of claim 1, wherein a refresh operation is enabled when a refresh operation request is input outside of an access subinterval, and wherein a refresh operation is delayed until after the end of the access subinterval when the refresh operation request is input during the access subinterval.

* * * * *

UNITED STATES PATENT AND TRADEMARK OFFICE
CERTIFICATE OF CORRECTION

PATENT NO. : 6,463,002 B2
DATED : October 8, 2002
INVENTOR(S) : Kim et al.

Figure 4A:
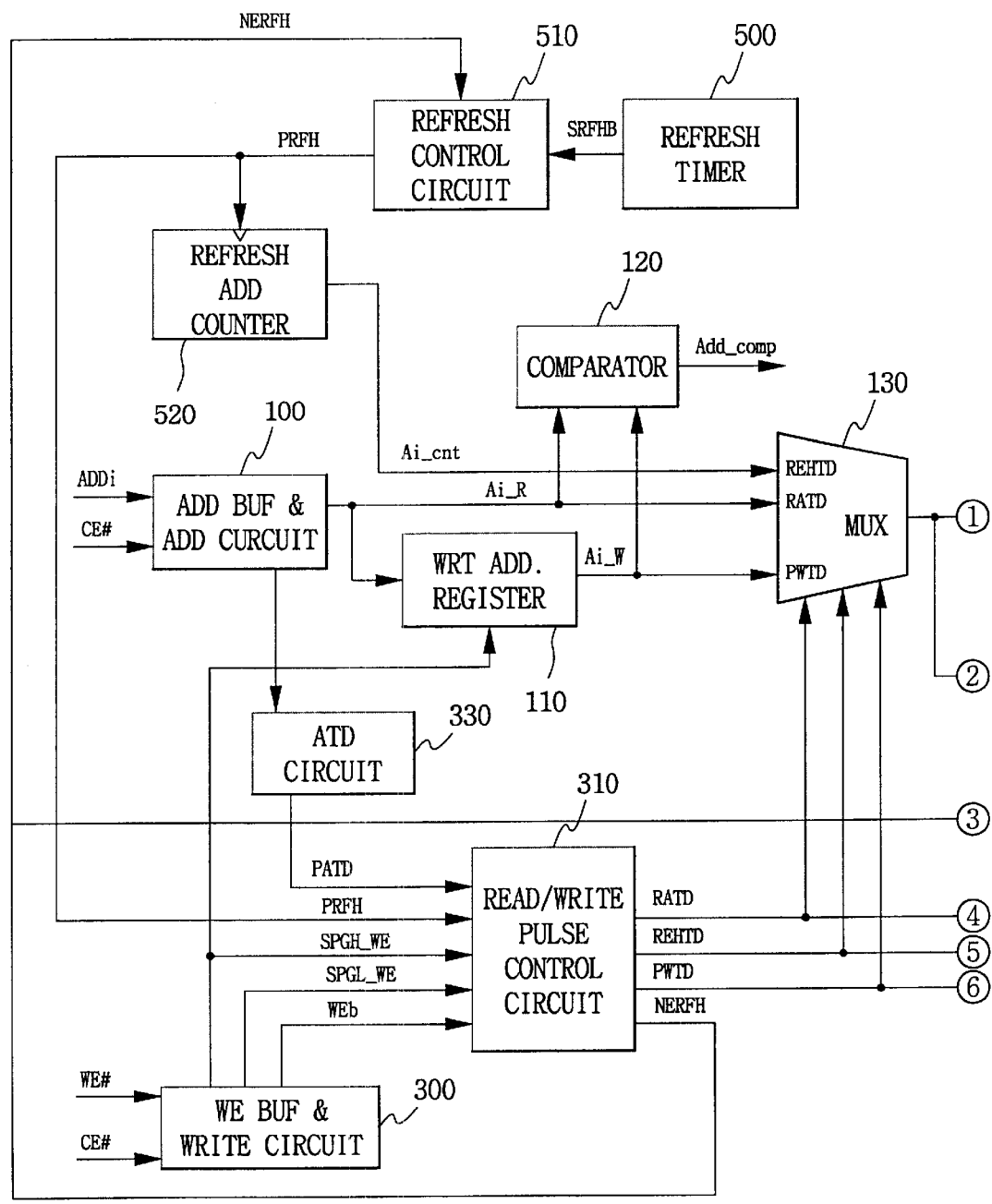
FIG. 4 is a block diagram showing an embodiment of the present invention.
Figure 4B:
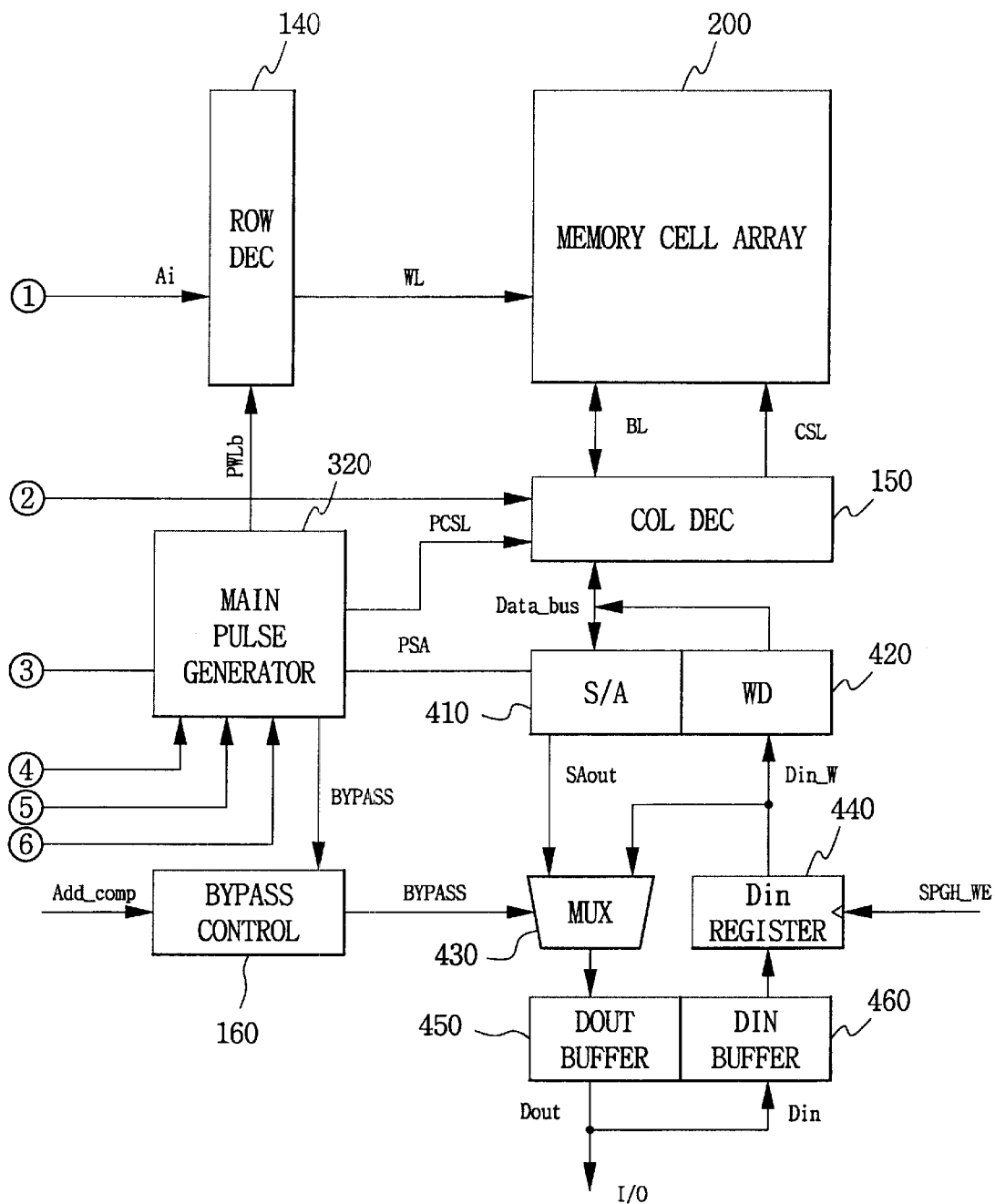

It is certified that error appears in the above-identified patent and that said Letters Patent is hereby corrected as shown below:

<u>Column 3,</u>
Line 62, "Fig. 4 is a block diagram" should read -- Fig. 4A/B are block diagrams --.

<u>Column 9,</u>
Line 63, "3SPGL_WE" should read -- SPGL_WE --.

<u>Column 10,</u>
Line 24, "200, After" should read -- 200. After --.
Line 29, "120A and 140B" should read -- 120A and 120B --.

Signed and Sealed this

Twenty-fifth Day of March, 2003

JAMES E. ROGAN
*Director of the United States Patent and Trademark Office*